(12) United States Patent
Porter et al.

(10) Patent No.: US 6,239,618 B1
(45) Date of Patent: May 29, 2001

(54) BUFFER WITH FAST EDGE PROPAGATION

(75) Inventors: John D. Porter, Meridian; Larren G. Weber, Caldwell; William N. Thompson, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/520,057

(22) Filed: Mar. 7, 2000

Related U.S. Application Data (63) Continuation of application No. 09/064,531, filed on Apr. 22, 1998, now Pat. No. 6,040,713.

(51) Int. Cl.[7] .................... H03K 19/0175; H03K 19/094
(52) U.S. Cl. .................... 326/83; 326/17; 326/86
(58) Field of Search .................. 326/86, 82, 83, 326/17, 21

(56) References Cited

U.S. PATENT DOCUMENTS

| | | | |
|---|---|---|---|
| 4,647,797 | * 3/1987 | Sanwo et al. | 326/86 |
| 5,410,262 | * 4/1995 | Kang | 327/108 |
| 5,489,858 | * 2/1996 | Pierce et al. | 326/56 |
| 5,612,630 | 3/1997 | Wright et al. . | |
| 5,701,090 | 12/1997 | Hidaka et al. . | |
| 5,963,047 | * 10/1999 | Kwong et al. | 326/27 |

* cited by examiner

Primary Examiner—Michael Tokar
Assistant Examiner—Daniel D. Chang
(74) Attorney, Agent, or Firm—Kirkpatrick & Lockhart LLP (57) ABSTRACT

A buffer having first and second input terminals and an output terminal. The buffer also includes a fast edge driver having an input terminal and an output terminal, with the input terminal connected to the first input terminal of the buffer, and the output terminal connected to the output terminal of the buffer. A shielding circuit is provided having an input terminal and an output terminal, with the input terminal connected to the second input terminal of the buffer. The buffer further includes a recovery circuit having an input terminal and an output terminal, with the input terminal connected to the output terminal of the shielding circuit, and the output terminal connected to the output terminal of the buffer.

35 Claims, 10 Drawing Sheets

BUFFER WITH FAST EDGE PROPAGATION

CROSS-REFERENCE TO RELATED APPLICATIONS

This application is a continuation of copending U.S. patent application Ser. No. 09/064,531, filed Apr. 22, 1998, now U.S. Pat. No. 6,040,713.

STATEMENT REGARDING FEDERALLY SPONSORED RESEARCH OR DEVELOPMENT

Not Applicable.

I. CROSS-REFERENCE TO RELATED APPLICATIONS (Not Applicable)

II. STATEMENT REGARDING FEDERALLY SPONSORED RESEARCH (Not Applicable)

III. BACKGROUND OF THE INVENTION

1. Field of the Invention

The present invention is directed generally to a buffer and, more particularly, to a buffer with a fast edge propagation.

2. Description of the Background

In a device, such as a semiconductor device, it is desirable to include a buffer which buffers the device input signals before they are communicated to the internal circuitry of the device. A buffer typically adapts the device input signals to internally required signal properties, such as signal voltage levels and transition delays, that must be present for internal circuitry to operate correctly. On devices which contain certain circuits, such as wide random access memory (RAM) circuits, input buffers must be placed around the die because the input/output pads are spread around the device.

When input buffers buffer certain time-dependent signals, such as the system clock signal input to a double data rate RAM, it is important to have a fast clock to data time (i.e. tKQ, tKHQV, and clock to out prop delay) on both edges of the clock. When conventional buffers, PLL circuits, or DLL circuits are used in such applications, there is no manner in which to stop the clock, there is excess capacitance on the lines, and there is a certain amount of clock distortion. Thus, there is a need for a buffer that can provide a fast clock to data time while allowing for clock stopping, providing low capacitance on the lines, and introducing a minimal amount of clock distortion.

IV. SUMMARY OF THE INVENTION

The present invention is directed to a buffer having first and second input terminals and an output terminal. The buffer includes a fast edge driver having an input terminal and an output terminal, with the input terminal connected to the first input terminal of the buffer, and the output terminal connected to the output terminal of the buffer. A shielding circuit is provided having an input terminal and an output terminal, with the input terminal connected to the second input terminal of the buffer. The buffer further includes a recovery circuit having an input terminal and an output terminal, with the input terminal connected to the output terminal of the shielding circuit, and the output terminal connected to the output terminal of the buffer.

The present invention is also directed to a method of propagating a first input signal. The method includes receiving the first input signal, receiving a second input signal, producing a delayed second input signal, driving the first input signal when a first input transition occurs, recovering the first input signal when a second transition occurs, and propagating the first input signal after one of the first and second input transitions occur.

The present invention represents a substantial advance over prior buffers. For example, the present invention has the advantage that it allows for clock stopping. Thus, qualified clocks can be used with the present invention, e.g. for part selection. The present invention also has the advantage that it provides for low capacitance on the lines. The present invention has the further advantage that it introduces a minimal amount of clock distortion.

V. BRIEF DESCRIPTION OF THE DRAWING

For the present invention to be clearly understood and readily practiced, the present invention will be described in conjunction with the following figures, wherein.

VI. DETAILED DESCRIPTION OF THE INVENTION

It is to be understood that the figures and descriptions of the present invention have been simplified to illustrate elements that are relevant for a clear understanding of the present invention, while eliminating, for purposes of clarity, many other elements found in a typical device. Those of ordinary skill in the art will recognize that other elements are desirable and/or required to implement a device incorporating the present invention. However, because such elements are well known in the art, and because they do not facilitate a better understanding of the present invention, a discussion of such elements is not provided herein.

As used and described herein, a signal followed by an asterisk ("*") indicates that the signal is a logical complement of a signal having the same designation but without the asterisk, e.g. CLKIN* is the logical complement of CLKIN. Similarly, input and output terminal designations that are followed by an asterisk are active low inputs and outputs.

Figure 1:
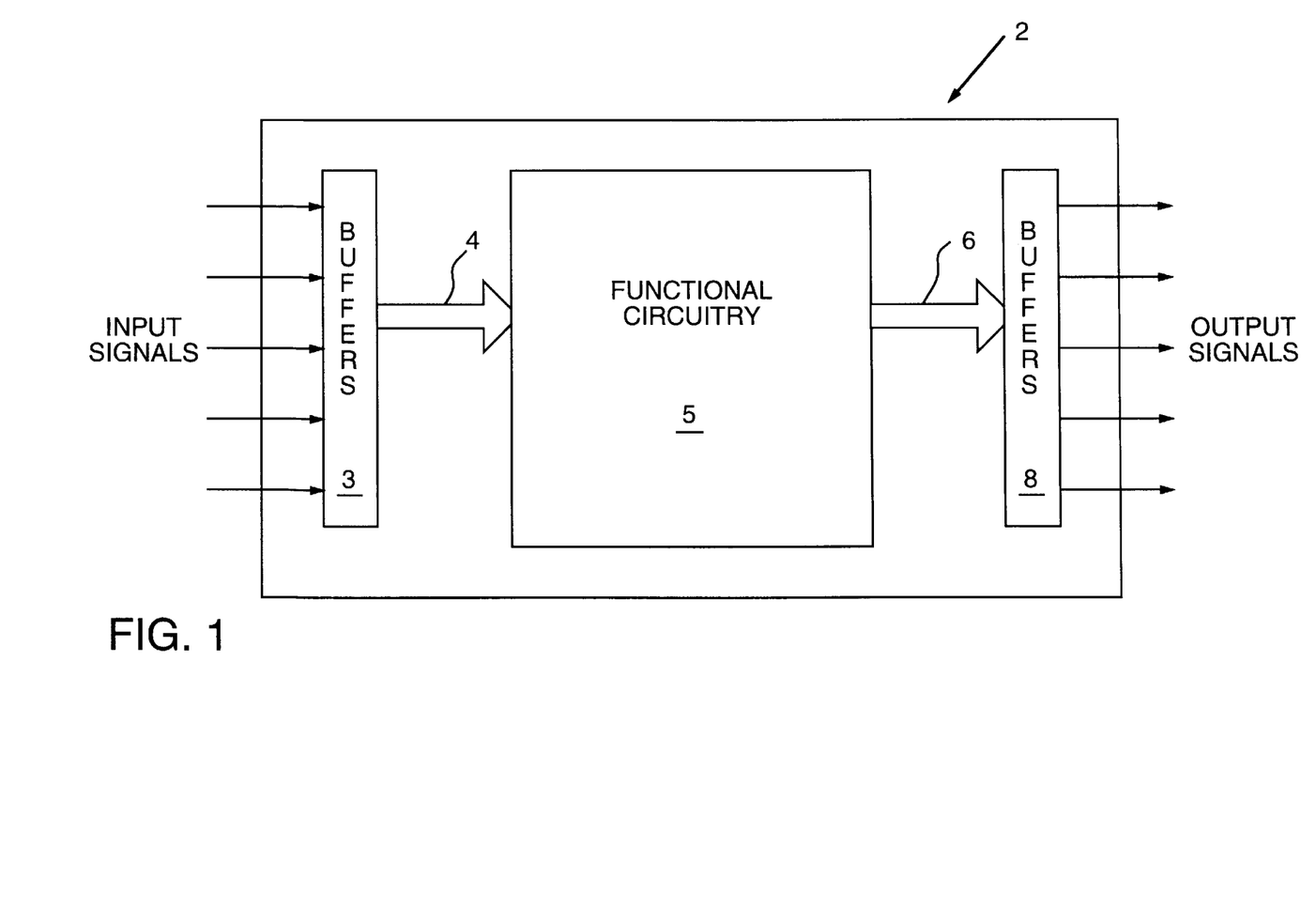
FIG. 1 is a block diagram illustrating a device that may be constructed with the present invention.

FIG. 1 is a block diagram illustrating a device 2 that may be constructed with the present invention. The device 2 may be one of many devices, such as, for example, a memory device or a processor. The device 2 may be a semiconductor device, and may be fabricated using any one of many different technologies, including silicon-on-insulator technology, silicon-on-sapphire technology, thin film transistor technology, and doping of a single crystal silicon substrate.

Input signals enter the device 2 through input buffers 3, which adapt the input signals to the voltage levels required by the device 2. The buffers 3 may include buffers, such as type disclosed herein in conjunction with the present invention. The buffers 3 provide signals, which are transmitted via a bus 4, to functional circuitry 5. The circuitry 5 may perform a number of functions depending on the function of the device 2. The circuitry 5 generates signals that are placed on a bus 6, which transmit the signals to output buffers 8. The buffers 8 may include buffers, such as the type disclosed herein in conjunction with the present invention. The signals generated by the buffers 8 are transmitted outside the device 2.

Figure 2:
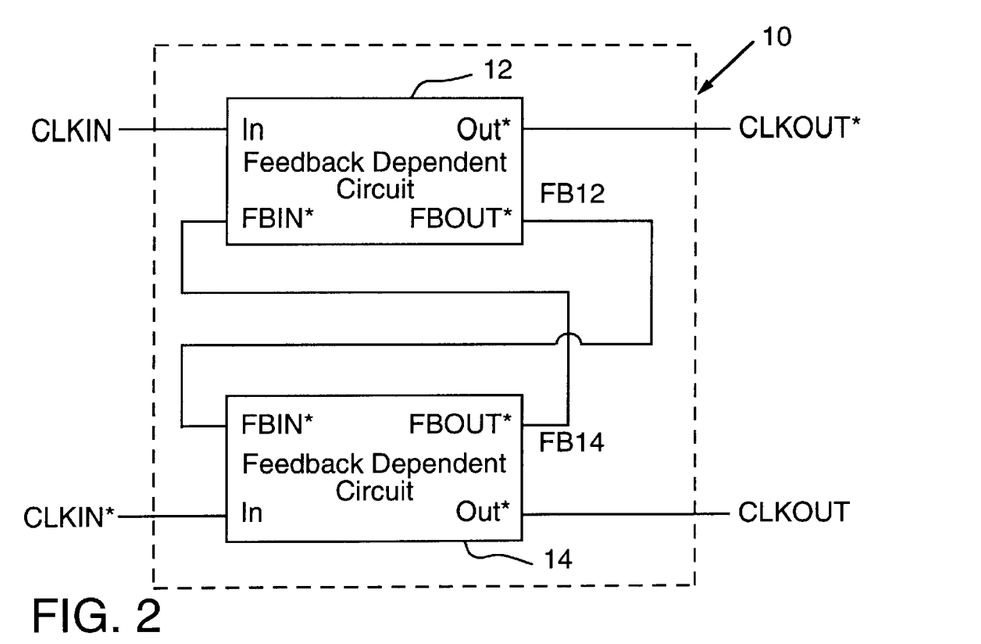
FIG. 2 is a block diagram illustrating a buffer.

FIG. 2 is a block diagram illustrating a buffer 10, such as may be incorporated in the buffers 3 and 8, as well as in the functional circuitry 5. Although the buffer 10 is illustrated as receiving a clock signal at its input, the buffer 10 can also be used to buffer other types of signals. In particular, the present invention may be used with any buffer that receives first and second input signals, and that produces at least one output signal. The present invention is particularly applicable to buffers receiving complementary input signals, although that is not required to realize the benefits of the present invention. The circuit 10 is illustrated as having a fast falling edge on the output. Thus, a high to low transition of the output closely follows a transition of the input with little delay, while a low to high transition of the output does not follow the transition of the input as closely. Of course, the present invention may also be embodied in a buffer having a fast rising edge on the output. Furthermore, alternating types of buffers may be cascaded (e.g. a buffer with a fast falling edge may be series-connected to a buffer with a fast-rising edge). For clarity, the buffer 10 will initially be described as including two feedback dependent circuits 12 and 14. Each of the circuits 12 and 14 receives either clock input signal CLKIN or CLKIN*. The clock input signal is conventionally generated off of the device on which the circuit 10 is incorporated.

The circuit 12 receives the clock input signal CLKIN and generates an inverted clock output signal CLKOUT*. The circuit 12 also generates a feedback signal FB12, which is input to the circuit 14. The circuit 14 receives the negative clock input signal CLKIN* and generates the clock output signal CLKOUT. The circuit 14 also receives the feedback sign FB12 from the circuit 12. The circuit 14 generates a feedback signal FB14 for use by the circuit 12. The circuits 12 and 14 may be identically constructed, although because they receive different input signals they will produce different output signals. Because the circuits 12 and 14 may be identically constructed, only embodiments of the circuit 14 are discussed hereinbelow. Signals that are generated internally to the circuit 12 are designated herein with the suffix "12" and those signals that are generated internally to the circuit 14 are designated herein with the suffix "14".

Figure 3:
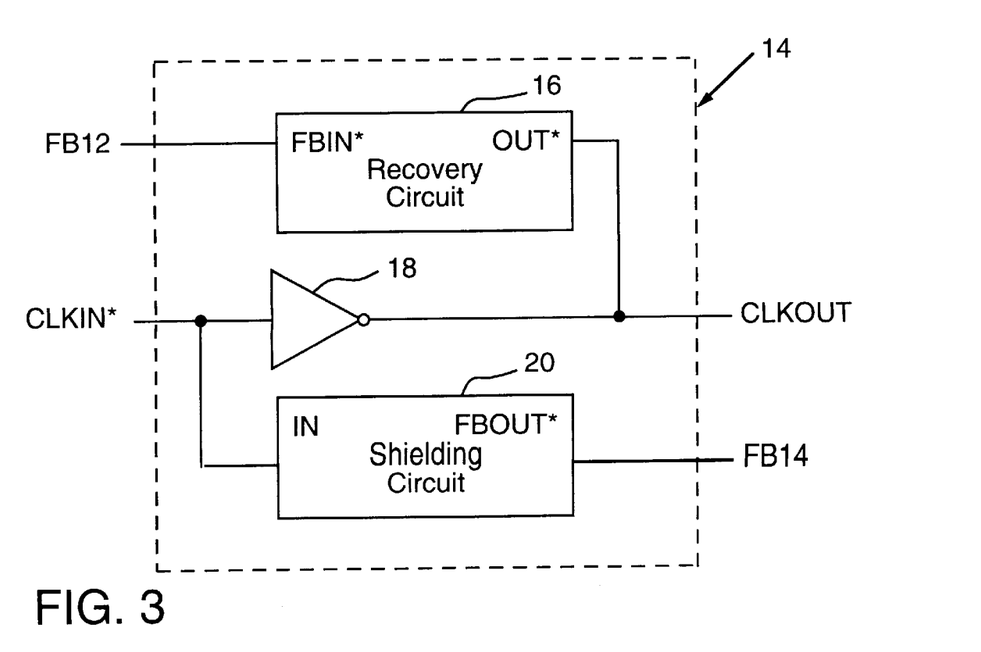
FIG. 3 is a block diagram illustrating an embodiment of the feedback dependent circuit of FIG. 2.

FIG. 3 is a block diagram illustrating an embodiment of the circuit 14 of FIG. 2. The feedback signal FB12 of the circuit 12 is input to a recovery circuit 16. The output of the recovery circuit 16 is tied to the clock output signal CLKOUT. A fast edge driver 18, such as an inverter, receives the negative clock input signal CLKIN* and its output is the clock output signal CLKOUT. The fast edge driver 18 has the characteristics of a skewed inverter and has a fast pull down and virtually no pull up so that the fast edge driver 18 has a low trip point. The fast edge driver 18 can be designed with a relatively small p-type device and a relatively large n-type device. Because of its design, the fast edge driver 18 is a holding device for the low state of the negative clock input signal CLKIN*. The characteristics of the fast edge driver 18 ensure a fast high to low output transition of the clock output signal CLKOUT. Although the circuit 14 is illustrated in FIG. 3 as propagating a fast high to low output transition of the clock output signal CLKOUT, the circuit 14 can be designed to propagate a fast low to high output transition of the clock output signal CLKOUT. Such a circuit would be the complement of the circuit 14 illustrated in FIG. 3.

A shielding circuit 20 isolates the input capacitance of the recovery circuit in the other feedback dependent circuit 12 from the fast edge transition of the clock input signal CLKIN*. The circuit 20 receives the negative clock input signal CLKIN* and outputs the feedback signal FB14 for use by the circuit 12.

Figure 4:
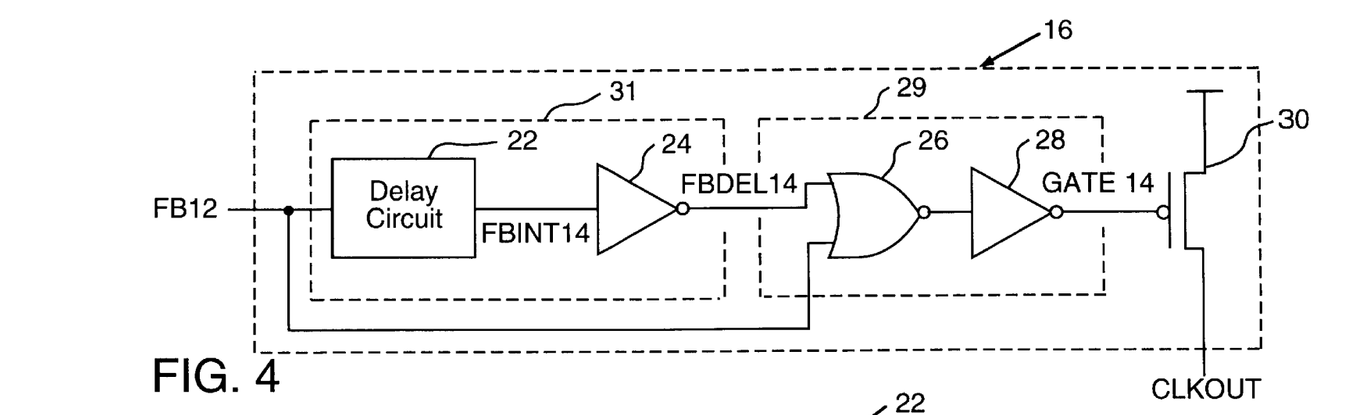
FIG. 4 is a block diagram illustrating an embodiment of the recovery circuit of FIG. 3.

FIG. 4 is a block diagram illustrating an embodiment of the recovery circuit 16 of FIG. 3. A delay circuit 22 receives the feedback signal FB12 from the circuit 12 and outputs the intermediate delayed feedback signal FBINT14, which is the signal FB12 delayed. The signal FBINT14 is input to an inverter 24. The output of the inverter 24 is the delayed feedback signal FBDEL14. The signal FBDEL14 and the signal FB12 are input to a NOR gate 26. The output of the NOR gate 26 is input to an inverter 28, whose output is the pulsed gate signal GATE14. The NOR gate 26 and the inverter 28 comprise a pulse circuit 29. The output of the inverter 28 is connected to the gate terminal of a p-type pullup device 30. The source terminal of the device 30 is pulled up and the drain terminal of the device 30 is connected to the clock output signal CLKOUT. The pulsed gate signal GATE14 places the device 30 in a conducting state when the signal GATE 14 transitions from high to low for a pulse. A delay path 31 through the circuit 16, which includes the delay circuit 22 and the inverter 24, operates to terminate the pulse of the signal GATE14 after a delay caused by the delay path. The recovery circuit 16 produces a pulsed signal to pull up the voltage of the clock output signal CLKOUT and thereby initiate a high output from the fast edge driver 18. That process is termed "recovery". Recovery of the slow edge of the clock output signal occurs during the pulse of the signal GATE14. The recovery of the slow edge of the clock output signal is necessary because the fast edge device 18 is skewed with a small p-type device and it cannot recover the edge itself. The pulsed gate signal GATE14 is pulsed on a slow edge transition of the clock output signal and terminated after a delay introduced by the delay path 31. The signal GATE14 is pulsed so that the recovery path is turned off when a fast edge is propagated in the circuit 14 one-half clock cycle later. Thus, the fast edge path in the circuit 14 does not have to contend with the recovery circuit 16 at that time. When the device 30 is not placed in a conducting state by a pulse of the signal GATE14, the output of the device 30 at its drain terminal is placed in a tri-state condition.

Figure 5:
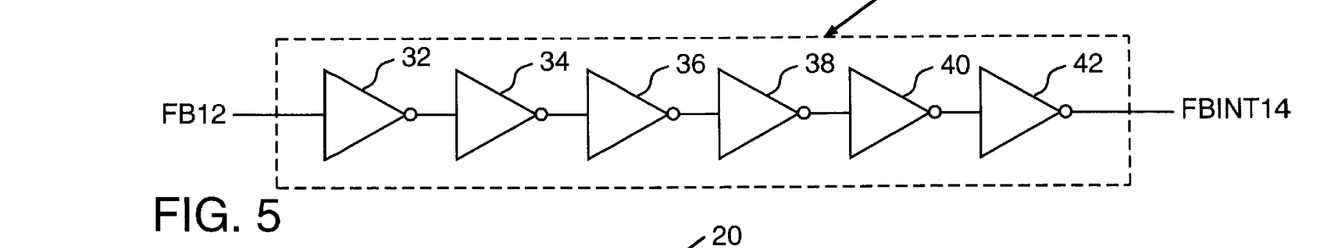
FIG. 5 is a block diagram illustrating an embodiment of the delay circuit of FIG. 4.

FIG. 5 is a block diagram illustrating an embodiment of the delay circuit 22 of FIG. 4. The circuit 22 includes six inverters 32, 34, 36, 38, 40, and 42. The feedback signal FB12 from the circuit 12 is input to the circuit 22 and is delayed by the inverters 32, 34, 36, 38, 40, and 42 to produce the intermediate delay signal FBINT14. Although six inverters are illustrated in FIG. 5, the circuit 22 may included any number of inverters to create the desired delay and the delay circuit 22 can also be constructed to pass the feedback signal FB12 in an inverted state.

Figure 6:
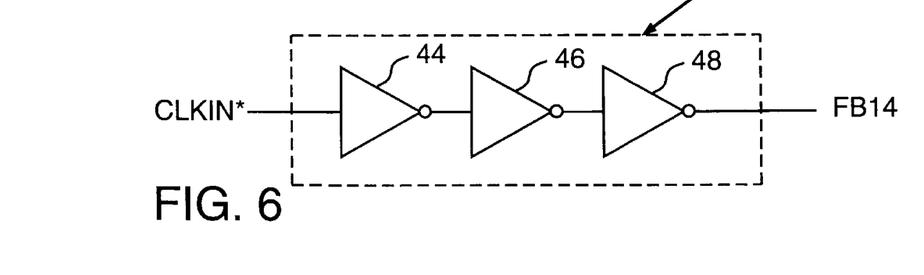
FIG. 6 is a block diagram illustrating an embodiment of the shielding circuit of FIG. 3.

FIG. 6 is a block diagram illustrating an embodiment of the shielding circuit 20 of FIG. 3. The circuit 20 includes three inverters 44, 46, and 48. The circuit 20 isolates the input capacitance of the recovery circuit 16 from the fast edge path (i.e. CLKIN* to CLKOUT) of the feedback dependent circuit 14. If the inverter chain consisting of the inverters 44, 46, and 48 has a fanout of 3, the shielding circuit 20 isolates approximately 96% of the capacitance of the recovery circuit 16 from the fast edge path of the circuit 14. This number is computed by subtracting the reciprocal of the fanout of the inverter chain taken to the power of the number of inverters from 1 and multiplying the result by 100. If the fanout of the inverter chain consisting of the inverters 44, 46, and 48 is increased, the amount of capacitance isolated by the shielding circuit 20 increases. The circuit 20 can include as many inverters as desired. The higher the number of inverters, the more isolated the capacitance of the recovery circuit 16 is from the fast edge path of the circuit 14. However, more inverters or higher fan outs make the recovery action of the recovery circuit 16 more delayed and thus distort the dual ended clock, reducing the maximum operating frequency of the buffer.

Figure 7:
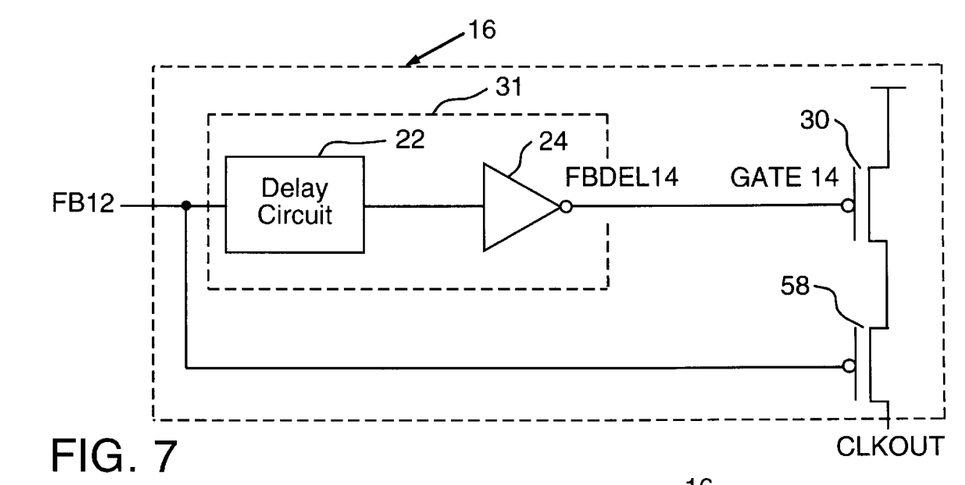
FIG. 7 is a block diagram illustrating an embodiment of the recovery circuit of FIG. 3.

FIG. 7 is a block diagram illustrating another embodiment of the recovery circuit 16. The recovery circuit 16 includes the delay circuit 22, whose output is the input to the inverter 24. The recovery circuit 16 and the inverter 24 constitute the delay path 31. The output of the delay path 31 is the delayed feedback signal FBDEL14, which is also the gate signal GATE14. The output of the inverter 24 is connected to the gate terminal of the p-type pullup device 30. The source terminal of the device 30 is pulled up and the drain terminal of the device 30 is connected to the source terminal of a p-type device 58. The gate terminal of the device 58 is connected to the feedback signal FB12 and the drain terminal of the device 58 is connected to the clock output signal CLKOUT. In the embodiment of the recovery circuit 16 shown in FIG. 7, the clock output signal CLKOUT is recovered when both the signal FB12 is low and the signal GATE14 is low, thus creating a conductive path to the clock output signal CLKOUT through the devices 30 and 58.

Figure 8:
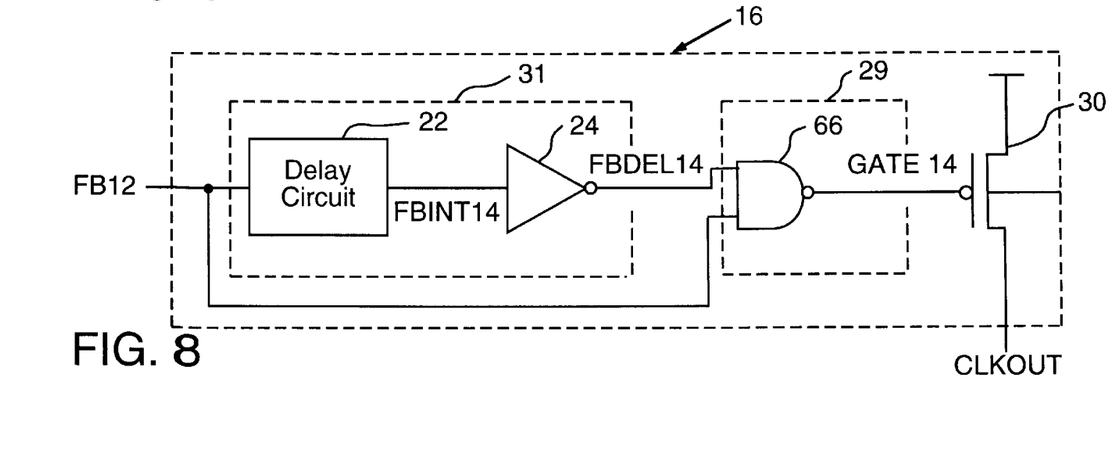
FIG. 8 is a block diagram illustrating an embodiment of the recovery circuit of FIG. 3.

FIG. 8 is a block diagram illustrating another embodiment of the recovery circuit 16. The recovery circuit 16 includes the delay circuit 22. The output of the delay circuit 22 is the intermediate delayed feedback signal FBINT14. The signal FBINT14 is input to the inverter 24. The delay circuit 22 and the inverter 24 comprise the delay path 31. The output of the inverter 24 is the delayed feedback signal FBDEL14. The input terminals of a NAND gate 66 are connected to the signal FBDEL14 and the feedback signal FB12. The NAND gate 66 comprises the pulse circuit 29. The output of the NAND gate 66 is the pulsed gate signal GATE14. The output of the NAND gate 66 is connected to the gate terminal of the p-type pullup device 30. The source terminal of the device 30 is pulled up and the drain terminal of the device 30 is connected to the clock output signal CLKOUT.

Figures 9, 10:
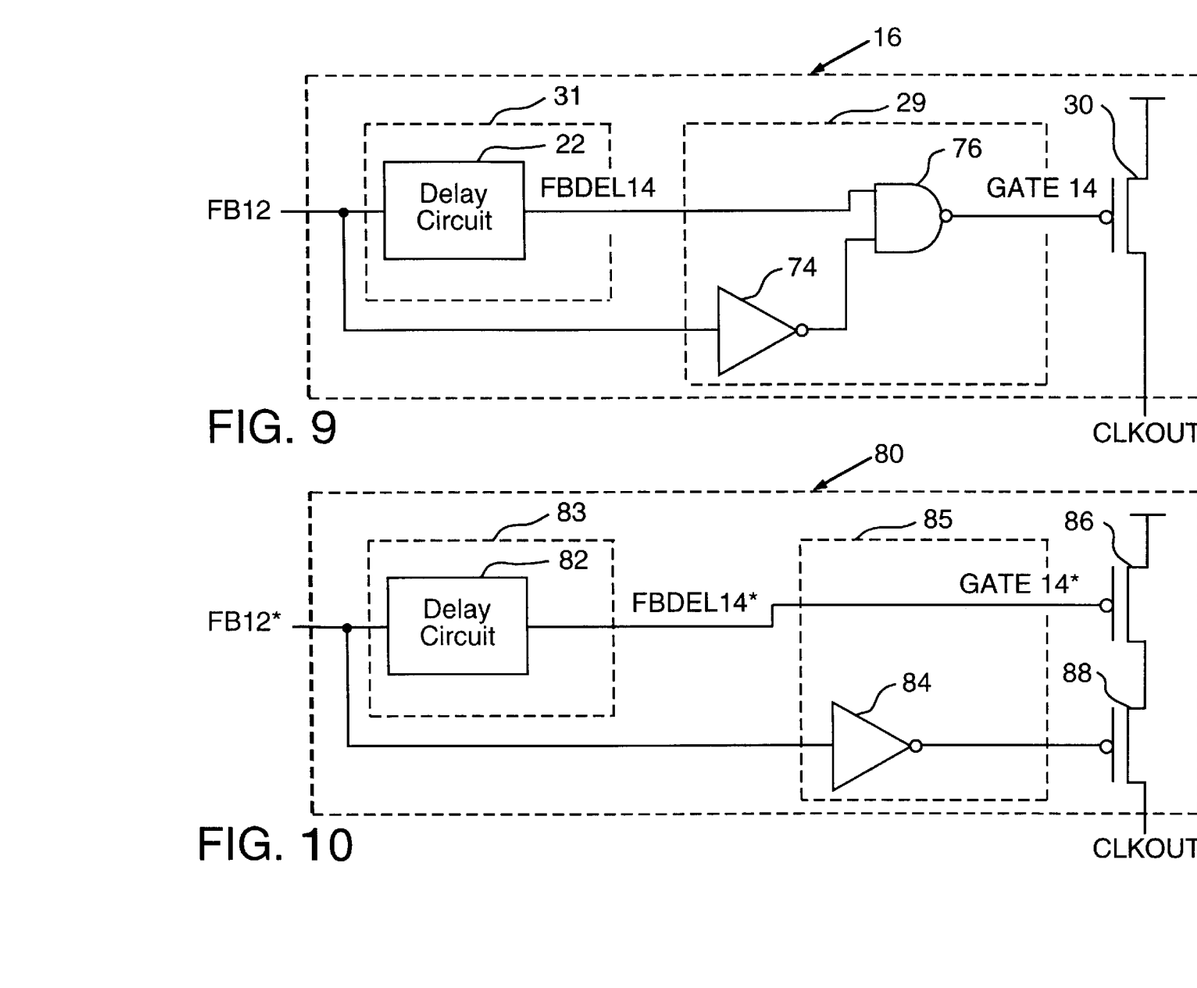
FIG. 9 is a block diagram illustrating an embodiment of the recovery circuit of FIG. 3.
FIG. 10 is a block diagram illustrating an embodiment of a recovery circuit.

FIG. 9 is a block diagram illustrating another embodiment of the recovery circuit 16. The recovery circuit 16 includes the delay circuit 22. An inverter 74 receives the feedback signal FB12 from the circuit 12 as an input. The output of the delay circuit 22 is the delayed feedback signal FBDEL14. A NAND gate 76 receives the output of the delay circuit 22 and the output of the inverter 74. The NAND gate 76 and the inverter 74 comprise the pulse circuit 29. The output of the NAND gate 76 is the pulsed gate signal GATE14. The output of the NAND gate 76 is connected to the gate terminal of the p-type pullup device 30. The source terminal of the device 30 is pulled up and the drain terminal of the device 30 is connected to the clock output signal CLKOUT.

FIG. 10 is a block diagram illustrating another embodiment of a recovery circuit 80 that can be used in a feedback dependent circuit. The reference numbers in FIG. 10 are different from those used in other figures to call attention to the fact that the recovery circuit 80 illustrated in FIG. 10 is designed to receive an inverted input signal FB12*. The circuit 80 is a recovery circuit, and is analogous to the recovery circuit 16 of FIG. 7, except that it is non-inverting. The recovery circuit 80 includes a delay circuit 82, which can be constructed similarly to the delay circuit 22 of FIG. 5. The delay circuit 82 is also a delay path 83. An inverter 84, which is in a circuit 85, receives the feedback signal FB12* as an input. FB12* is a logical compliment of the signal FB12 in FIG. 7. The output of the delay circuit 82, delayed feedback signal FBDEL14*, which is also the gate signal GATE14*, is input to the gate terminal of a p-type pullup device 86. The source terminal of the device 86 is pulled up and the drain terminal of the device 86 is connected to the source terminal of a p-type device 88. The gate terminal of the device 88 is connected to the output of the inverter 84 and the drain terminal is connected to the clock output signal CLKOUT. In the embodiment of the recovery circuit 80 shown in FIG. 10, the clock output signal CLKOUT is recovered when both the signal FB12* is high and the signal GATE14* is low, thus creating a conductive path to the clock output signal CLKOUT through the devices 86 and 88.

Figure 11:
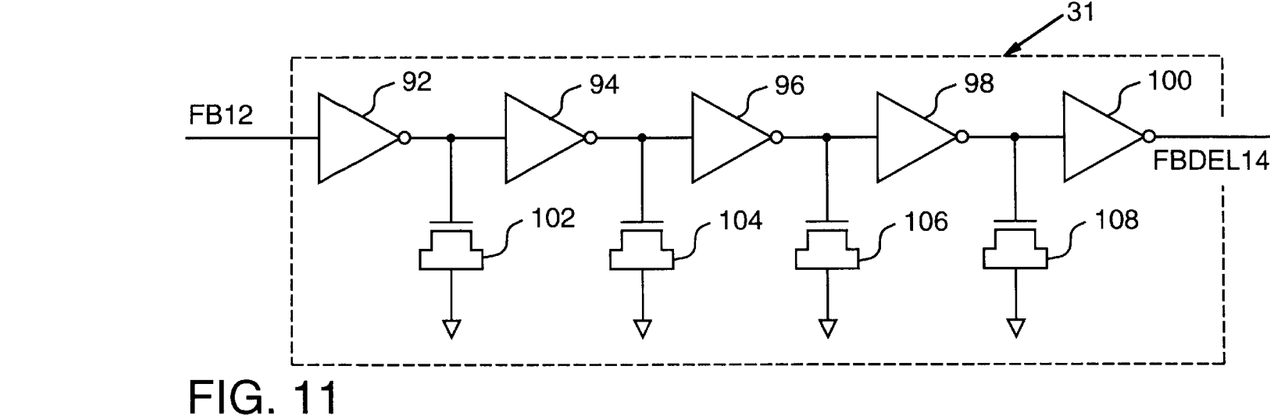
FIG. 11 is a block diagram illustrating an embodiment of the delay path of FIG. 4.

FIG. 11 is a block diagram illustrating another embodiment of the delay path 31. The path 31 includes a series of five inverters 92, 94, 96, 98, and 100. The path 31 also includes n-type MOS capacitors 102, 104, 106, and 108 which are connected between the outputs of the inverters 92, 94, 96, 98 and GND. The path 31 receives the feedback signal FB12 and delays it to produce the delayed feedback signal FBDEL14. The capacitors 102, 104, 106, and 108 can be of any type of capacitor suitable such as, for example, p-type MOS capacitors, metal plate capacitors, or a combination of different types of capacitors. The capacitors 102, 104, 106, and 108 may also be connected between the outputs of the inverters 92, 94, 96, 98 and Vcc.

Figure 12:
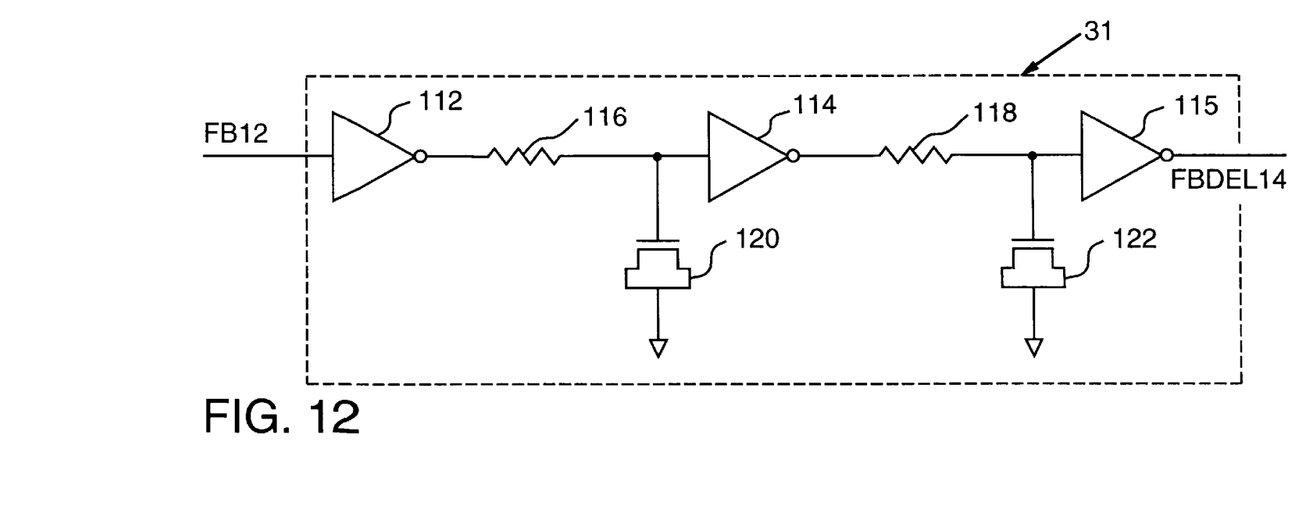
FIG. 12 is a block diagram illustrating an embodiment of the delay path of FIG. 4.

FIG. 12 is a block diagram illustrating another embodiment of the delay path 31. The path 31 has three inverters 112, 114, and 115 connected serially with resistors 116 and 118 connected to the outputs of the inverters 112 and 114. respectively. N-type MOS capacitors 120 and 122 are connected between the resistors 116 and 118 and GND. The path 31 receives the feedback signal FB12 and delays it to produce the delayed feedback signal FBDEL14. The capacitors 120 and 122 can be of any type of capacitor suitable such as, for example, p-type MOS capacitors, metal plate capacitors, or a combination of different types of capacitors.

The capacitors 120 and 122 may also be connected between the resistors 116 and 118 and Vcc.

Figure 13:
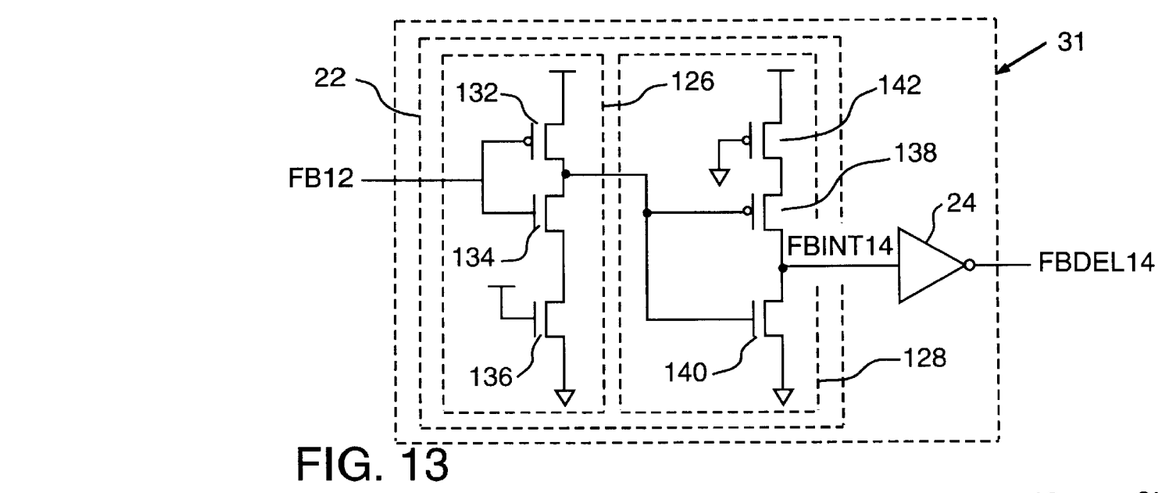
FIG. 13 is a block diagram illustrating an embodiment of the delay path of FIG. 4.

FIG. 13 is a block diagram illustrating another embodiment of the delay path 31. The path 31 includes three inverters 126, 128, and 24. The inverters 126 and 128 comprise the delay circuit 22. The inverter 126 includes p-type and n-type devices 132 and 134 which invert the feedback signal FB12. The inverter 126 also includes an n-type put-down device 136, which is constructed as a weak device. Thus, the device 136 limits the pulldown speed of the inverter 126 which propagates a slow high to low edge transition at the output of the inverter 126. The inverter 128 includes p-type device 138 and n-type device 140 which invert the output signal of the inverter 126. A p-type pullup device 142 is constructed as a weak device. Thus, the device 140 limits the pullup speed of the inverter 128 which propagates a slow low to high edge transition at the output of the inverter 128. The output of the inverter 128, the intermediate feedback signal FBINT14, is input to the inverter 24. The output of the inverter 24 is the delayed feedback signal FBDEL14. The circuit 22 is configured as an inverter chain with current starving. The embodiments of the delay path 31 illustrated in FIGS. 12 and 13 may be combined to create an inverter chain with current starving having added capacitance to Vcc or GND.

Figure 14:
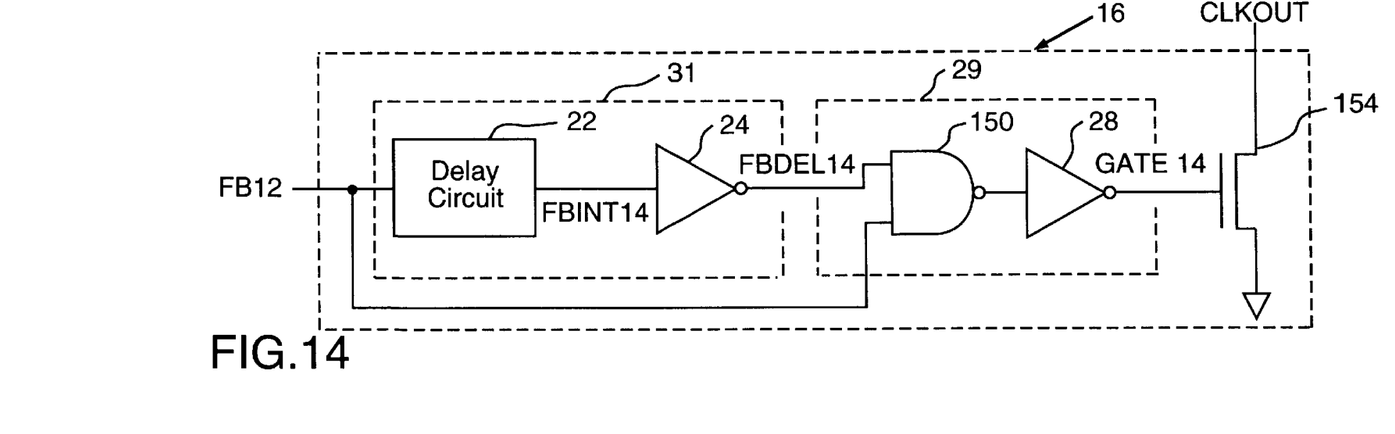
FIG. 14 is a block diagram illustrating an embodiment of a complementary recovery circuit.

FIG. 14 is a block diagram illustrating another embodiment of the recovery circuit 16. The circuit 16 is designed to be incorporated into a buffer which propagates the output low to high transition quickly, and is a complement circuit to the recovery circuit illustrated in FIG. 4. Such a complement buffer would also contain inverters analogous to the inverter 18 but would be skewed to have a fast pull up and virtually no pull down so that the inverted would have a high trip point. The circuit 16 includes the delay circuit 22 which delays the feedback signal FB12 to create the intermediate feedback signal FBINT14. The inverter 24 inverts the signal FBINT14 to create the delayed feedback signal FBDEL14. The delay circuit 22 and the inverter 24 comprise the delay path 31. The signal FBDEL14 is input to a NAND gate 150, which also receives the feedback signal FB12. The output of the NAND gate 150 is input to the inverter 28. The NAND gate 150 and the inverter 28 comprise the pulse circuit 29. The output of the inverter 28, pulsed gate signal GATE 14, is connected to the gate terminal of an n-type pulldown device 154. The source terminal of the device 154 is connected to GND and the drain terminal of the device 154 is connected to the clock output signal CLKOUT. Alternating buffers 10 which are complements can be used to distribute a fast edge of a signal around an entire device, e.g. a buffer with a fast high to low edge transition could be cascaded with a buffer having a fast low to high edge transition.

Figure 15:
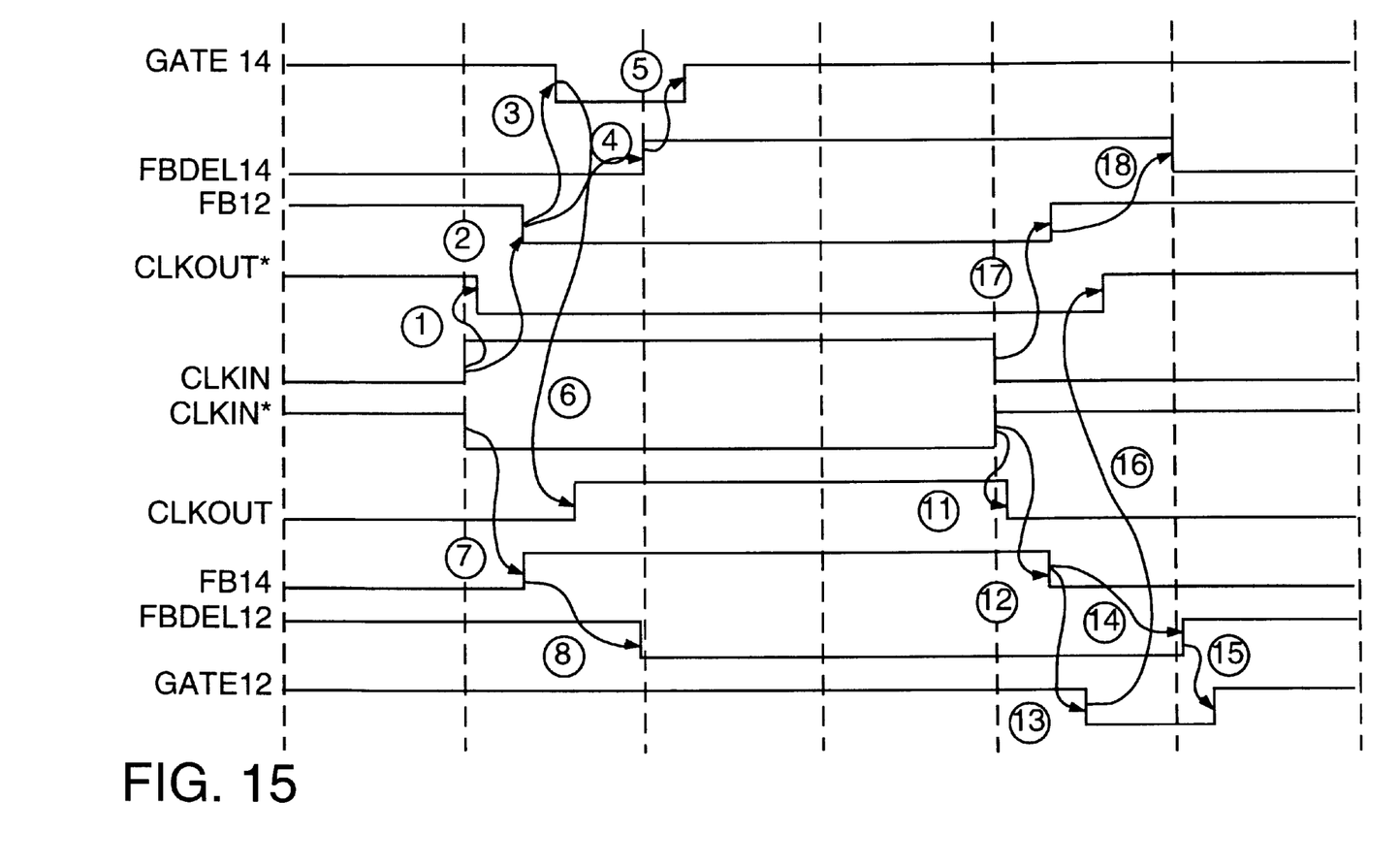
FIG. 15 is a timing diagram illustrating the operation of the buffer of FIG. 2.

FIG. 15 is a timing diagram illustrating the operation of the buffer 10. The fast edge transition of the inverted clock output signal CLKOUT* of the circuit 10 is indicated at 1. When the clock input signal CLKIN transitions from low to high, the inverted clock output signal CLKOUT* transitions from high to low with little delay. The feedback signal FB12 transitions from high to low after a delay introduced by a shielding circuit internal to the circuit 12, which is analogous to the shielding circuit 20, as indicated at 2. Following the transition in the feedback signal FB12, the pulsed signal GATE14 output from the inverter 28 in the recovery circuit 16 transitions from high to low as indicated at 3. Also, the delayed feedback signal FBDEL14, which is the delayed feedback signal output from the inverter 24, transitions from low to high as indicated at 4. The transition of the signal FBDEL14 terminates the pulse of the signal GATE14 as indicated at 5. The negative transition of the pulse of the signal GATE14 causes the recovery from low to high of the clock output signal CLKOUT as indicated at 6. When the inverted clock input signal CLKIN* transitions from high to low, the feedback signal FB14, which is output from the shielding circuit 20, transitions from low to high after a short delay as indicated at 7. Following the transition of the signal FB14, the delayed feedback signal FBDEL12, which is internal to a recovery circuit in the feedback dependent circuit 12, transitions from high to low as indicated at 8. The recovery circuit in the circuit 12 is analogous to the recovery circuit 16.

The fast edge transition of the clock output signal CLKOUT of the circuit 10 is indicated at 11. When the inverted clock input signal CLKIN* transitions from low to high, the clock output signal CLKOUT transitions from high to low with little delay. The feedback signal FB14 transitions from high to low after a delay introduced by the shielding circuit 20, as indicated at 12. Following the transition in the feedback signal FB14, the pulsed signal GATE12, which is internal to a recovery circuit in the circuit 12 and which is analogous to the recovery circuit 16, transitions from high to low as indicated at 13. Also, the delayed feedback signal FBDEL12, which is the delayed feedback signal output from an inverter which is analogous to the inverter 24 and which is internal to the circuit 12, transitions from low to high as indicated at 14. The transition of the signal FBDEL12 terminates the pulse of the signal GATE12 as indicated at 15. The negative transition of the pulse of the signal GATE12 causes the recovery from low to high of the inverted clock output signal CLKOUT* as indicated at 16. When the clock input signal CLKIN transitions from high to low, the feedback signal FB12, which is output from a shielding circuit which is analogous to the shielding circuit 20 and which is internal to the circuit 12, transitions from low to high after a short delay as indicated at 17. Following the transition of the signal FB12, the delayed feedback signal FBDEL14, which is output from the delayed path 31, transitions from high to low as indicated at 18.

Figure 16:
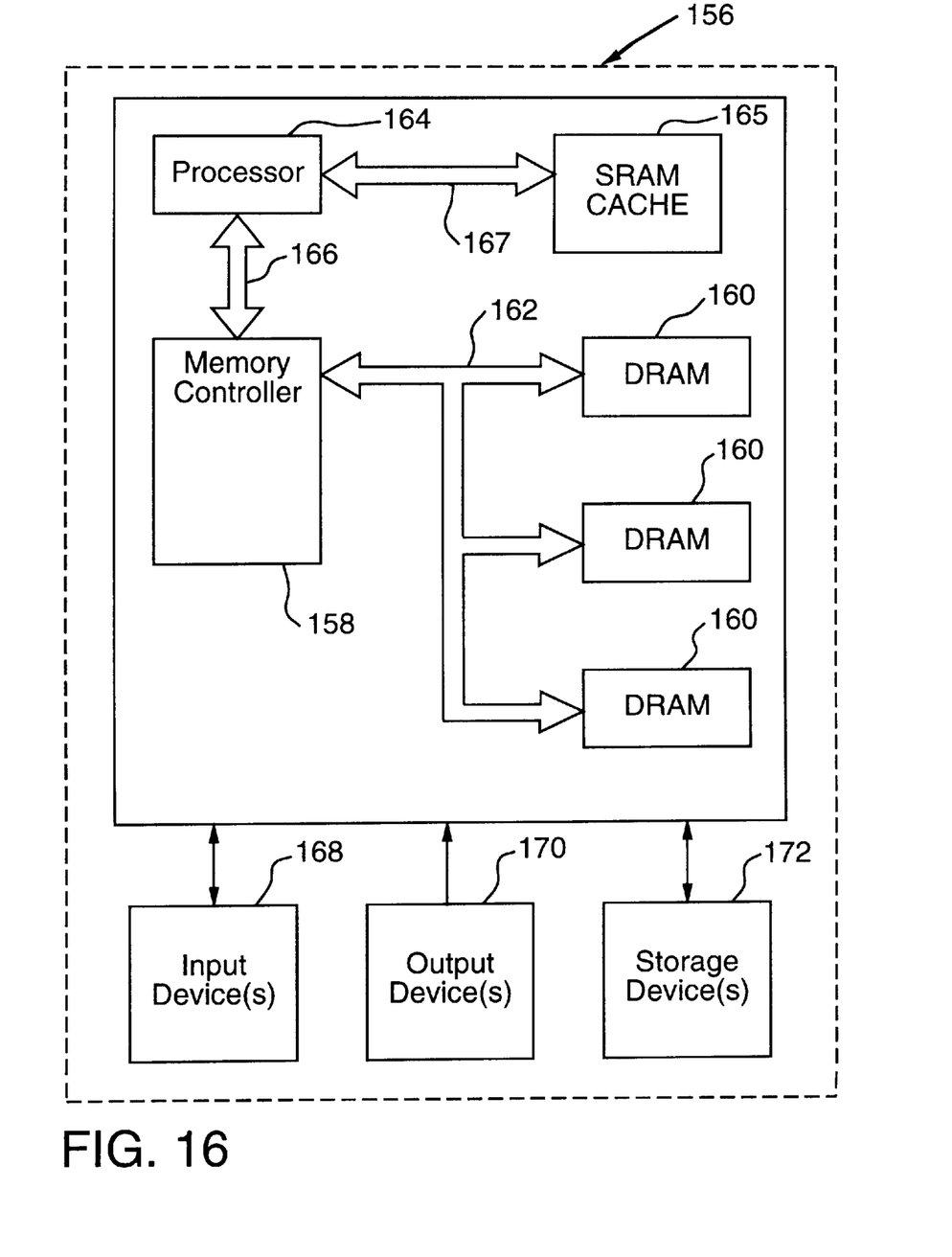
FIG. 16 is a block diagram illustrating a computer system.

FIG. 16 is a block diagram illustrating a computer system 156. The computer system 156 utilizes a memory controller 158 in communication with DRAMs 160 through a bus 162. The memory controller 158 is also in communication with a processor 164 through a bus 166. The processor 164 is in communication with an SRAM cache 165 through a bus 167. The processor 164 can perform a plurality of functions based on information and data stored in the DRAMs 160 and the SRAM cache 165. One or more input devices 168, such as a keypad or a mouse, are connected to the processor 164 to allow an operator to manually input data, instructions, etc. One of more output devices 170 are provided to display or otherwise output data generated by the processor 164. Examples of output devices include printers and video display units. One or more data storage devices 172 may be coupled to the processor 164 to store data on, or retrieve information from, external storage media. Examples of storage devices 172 and storage media include drives that accept hard and floppy disks, tape cassettes, and CD read only memories. The buffer of the present invention can be incorporated in circuits, such as clock buffers, on the processor 164, the memory controller 158, the DRAMS 160, and the SRAM cache 165.

Figure 17:
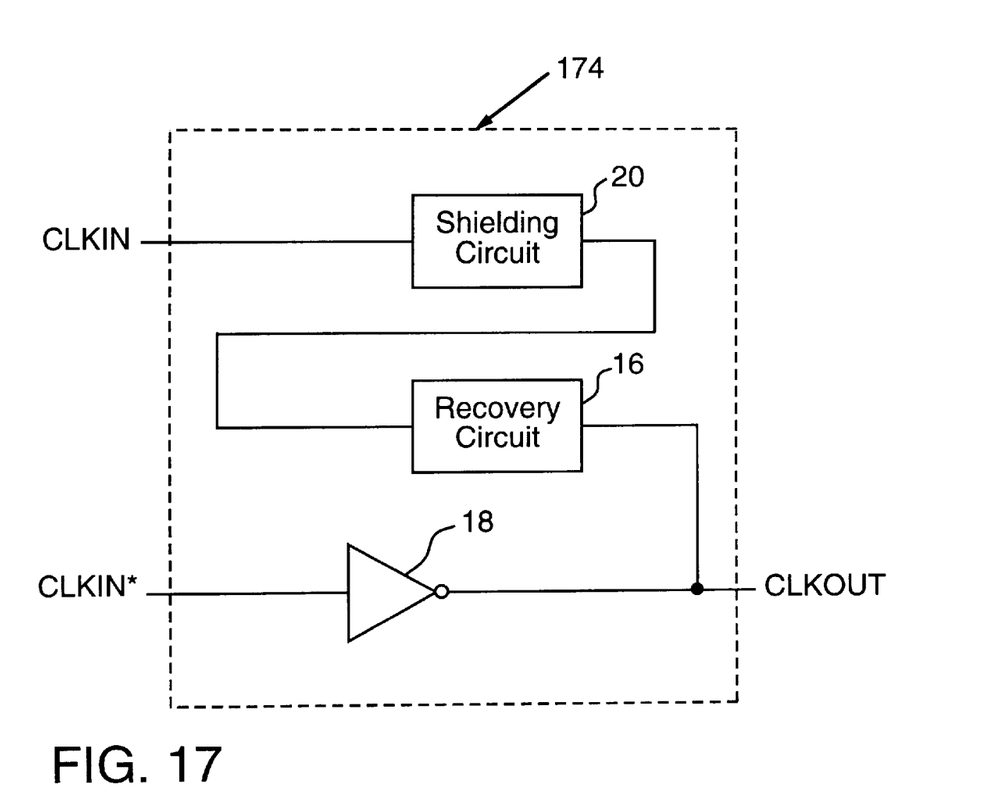
FIG. 17 is a block diagram illustrating a buffer with one output port.

FIG. 17 is a block diagram illustrating a buffer 174 with one output port. The positive clock input signal CLKIN is input to the shielding circuit 20. The output of the shielding circuit 20 is input to the recovery circuit 16. The negative clock input signal CLKIN* is input to the inverter 18. The output of the inverter 18 is the positive clock output signal CLKOUT. The output of the inverter 18 and the recovery circuit 16 are connected to an output terminal providing the output signal CLKOUT.

The present invention is also directed to a method of propagating a transition of a first input signal having either a positive transition or a negative transition, to an output signal of a buffer, with the positive transition appearing at the output after a delay. The method includes the steps of delaying a second input signal and driving the first input signal through a fast edge driver to propagate the transition of the first input signal. The method also includes the step of recovering the transition of the first input signal when the transitior is a negative transition using the delayed second input signal. The method further includes the steps of outputting the driven signal when the transition is a positive transition and outputting the recovered transition when the transition is a negative transition.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A buffer having first and second input terminals and an output terminal, comprising:
    a fast edge driver having an input terminal connected to the first input terminal of the buffer, and having an output terminal connected to the output terminal of the buffer;
    a recovery circuit having an input terminal and an output terminal, wherein the output terminal of the recovery circuit is connected to the output terminal of the buffer; and
    a shielding circuit having an input terminal connected to the second input terminal of the buffer, and having an output terminal connected to the input terminal of the recovery circuit and to the exclusion of the input terminal of the fast edge driver.

2. The buffer of claim 1, wherein the fast edge driver includes an inverter having a low trip point.

3. The buffer of claim 1, wherein the fast edge driver includes an inverter having a high trip point.

4. The buffer of claim 1, wherein the shielding circuit includes a plurality of series-connected inverters.

5. The buffer of claim 1, wherein the recovery circuit includes:
    a delay path having an input terminal connected to the output terminal of the shielding circuit, and having an output terminal;
    an inverter having an input terminal connected to the output terminal of the shielding circuit;
    a first switch having first and second terminals and a gate terminal, wherein the first and second terminals have a conduction path therebetween, and wherein the first terminal is connected to a power rail and the gate terminal is connected to the output terminal of the delay circuit; and
    a second switch having first and second terminals and a gate terminal, wherein the first and second terminals have a conduction path therebetween, and wherein the first terminal is connected to the second terminal of the first switch, the second terminal is connected to the output terminal of the buffer, and the gate terminal is connected to an output terminal of the inverter.

6. The buffer of claim 1, wherein the recovery circuit includes:
    a delay path having an input terminal connected to the output terminal of the shielding circuit and having an output terminal;
    a first switch having first and second terminals and a gate terminal, wherein the first and second terminals have a conduction path therebetween, and wherein the first terminal is connected to a power rail and the gate terminal is connected to the output terminal of the delay path; and
    a second switch having first and second terminals and a gate terminal, wherein the first and second terminals have a conduction path therebetween, and wherein the first terminal is connected to the second terminal of the first switch, the second terminal is connected to the output terminal of the buffer, and the gate terminal is connected to the output terminal of the shielding circuit.

7. The buffer of claim 6, wherein the delay path includes:
    a delay circuit having an input terminal connected to the output terminal of the shielding circuit and having an output terminal; and
    an inverter having an input terminal connected to the output terminal of the delay circuit, and having an output terminal connected to the first input terminal of the pulse circuit.

8. The buffer of claim 1, wherein the recovery circuit includes:
    a delay path having an input terminal connected to the output terminal of the shielding circuit and having an output terminal;
    a pulse circuit having a first input terminal connected to the output terminal of the delay path, a second input terminal connected to the output terminal of the shielding circuit, and an output terminal; and
    a switch having first and second terminals and a gate terminal, wherein the first and second terminals have a conduction path therebetween, and wherein the first terminal is connected to a power rail, the second terminal is connected to the output terminal of the buffer, and the gate terminal is connected to the output terminal of the pulse circuit.

9. The buffer of claim 8, wherein the delay path includes:
    a delay circuit having an input terminal connected to the output terminal of the shielding circuit, and having an output terminal; and
    an inverter having an input terminal connected to the output terminal of the delay circuit, and having an output terminal connected to the first input terminal of the pulse circuit.

10. The buffer of claim 8, wherein the delay path includes a delay circuit having a plurality of series-connected inverters.

11. The buffer of claim 10, wherein the delay circuit includes:
    a first inverter including:
        a first switch having first and second terminals and a gate terminal, wherein the first and second terminals have a conduction path therebetween, and wherein the first terminal is connected to a first power rail and the gate terminal is connected to the output terminal of the shielding circuit;
        a second switch having first and second terminals and a gate terminal, wherein the first and second terminal have a conduction path therebetween, and wherein the first terminal is connected to the second terminal of the first switch and the gate terminal is connected to the output terminal of the shielding circuit; and a third switch having first and second terminal and a gate terminal, wherein the first and second terminals have a conduction path therebetween, and wherein the first terminal is connected to the second terminal of the second switch, the second terminal is connected to a second power rail, and the gate terminal is connected to the first power rail; and a second inverter including:

a fourth switch having first and second terminals and a gate terminal, wherein the first and second terminals have a conduction path therebetween, and wherein the first terminal is connected to the first power rail and the gate terminal is connected to the second power rail;

a fifth switch having first and second terminals and a gate terminal, wherein the first and second terminals have a conduction path therebetween, and wherein the first terminal is connected to the second terminal of the fourth switch and the gate terminal is connected to the second terminal of the first switch; and a sixth switch having first and second terminals and a gate terminal, wherein the first and second terminals have a conduction path therebetween, and wherein the first terminal is connected to the second terminal of the fifth switch, the second terminal is connected to the second power rail, and the gate terminal is connected to the second terminal of the first switch.

12. The buffer of claim 8, wherein the pulse circuit includes a logic circuit having a first input terminal connected to the output terminal of the delay path, a second input terminal connected to the output terminal of the shielding circuit, and having an output terminal connected to the gate terminal of the switch.

13. The buffer of claim 12, wherein the logic circuit is selected from the group consisting of a NOR gate and a NAND gate.

14. The buffer of claim 12, wherein the pulse circuit further includes an inverter having an input terminal connected to the output terminal of the logic circuit and an output terminal connected to the gate terminal of the switch.

15. The buffer of claim 12, wherein the pulse circuit further includes an inverter having an input terminal connected to the output terminal of the shielding circuit and an output terminal connected to the second input terminal of the logic circuit.

16. The buffer of claim 8, wherein the delay path includes:

a plurality of series-connected inverters, each inverter having an output terminal; and a plurality of capacitors, wherein each capacitor is connected between the output terminal of one of the plurality of inverters and a common node.

17. The buffer of claim 16, wherein the delay path further includes a plurality of resistors, and wherein each resistor is connected between the output terminal of one of the plurality of inverters and one of the plurality of capacitors.

18. The buffer of claim 16, wherein the capacitors are selected from the group consisting of n-type MOS capacitors, p-type MOS capacitors, and metal plate capacitors.

19. A device, comprising:

a logic circuit; and a buffer connected to the logic circuit, the buffer having first and second input terminals and an output terminal, wherein the buffer includes:

a fast edge driver having an input terminal connected to the first input terminal of the buffer, and having an output terminal connected to the output terminal of the buffer;

a recovery circuit having an input terminal and an output terminal, wherein the output terminal of the recovery circuit is connected to the output terminal of the buffer; and a shielding circuit having an input terminal connected to the second input terminal of the buffer, and having an output terminal connected to the input terminal of the recovery circuit and to the exclusion of the input terminal of the fast edge driver.

20. The device of claim 19, wherein the buffer is external to the functional circuitry.

21. The device of claim 19, wherein the buffer is internal to the functional circuitry.

22. The device of claim 19, wherein the device includes a memory device, and further comprising a memory array connected to the functional circuitry.

23. A system, comprising:

a processor;

a memory device;

a bus connecting the processor and the memory device; and a buffer in at least one of the processor and the memory device, the buffer having first and second input terminals and an output terminal, wherein the buffer includes:

a fast edge driver having an input terminal connected to the first input terminal of the buffer, and having an output terminal connected to the output terminal of the buffer;

a recovery circuit having an input terminal and an output terminal, wherein the output terminal of the recovery circuit is connected to the output terminal of the buffer; and a shielding circuit having an input terminal connected to the second input terminal of the buffer, and having an output terminal connected to the input terminal of the recovery circuit and to the exclusion of the input terminal of the fast edge driver.

24. The system of claim 23, further comprising a memory controller, and wherein the bus includes:

a first bus connecting the processor and the memory controller; and a second bus connecting the memory controller and the memory device.

25. The system of claim 23, wherein the memory device includes is a cache memory.

26. The system of claim 23, further comprising:

a cache memory; and a bus connecting the cache memory and the processor.

27. A method of buffering first and second input signals, comprising:

delaying the first and second input signals;

inverting the first input signal when one of a positive transition and a negative transition of the first input signal occurs;

recovering the first input signal using the delayed second input signal when the other of the positive transition and the negative transition of the first input signal occurs;

inverting the second input signal when one of a positive transition and a negative transition of the second input signal occurs; and recovering the second input signal using the delayed first input signal when the other of the positive transition and the negative transition of the second input signal occurs.

28. The method of claim 27, wherein delaying the first input signal and inverting the first input signal are performed concurrently.

29. The method of claim 27, wherein delaying the first input signal includes propagating the first input signal through a second plurality of series-connected inverters.

30. The method of claim 27, wherein delaying the second input signal includes delaying an input signal which is a complement of the first input signal.

31. The method of claim 27, wherein:

inverting the second input signal includes inverting the second input signal when a positive transition of the second input signal occurs; and recovering the second input signal includes recovering the second input signal using the delayed first input signal when a negative transition of the second input signal occurs.

32. The method of claim 31, wherein inverting the second input signal when a positive transition of the second input signal occurs includes driving a second fast edge driver having a low trip point with the second input signal.

33. The method of claim 32, wherein recovering the second input signal when a negative transition of the second input signal occurs includes:

generating a second pulse signal with the delayed first input signal; and pulling up a voltage of an output signal from the second fast edge driver when a negative transition of the second input signal occurs with a second pull-up device pulsed by the second pulse signal.

34. The method of claim 27, wherein delaying the first and second input signals includes delaying complementary first and second input signals.

35. The method of claim 27, wherein:

inverting the first input signal includes inverting the first input signal when a positive transition of the first input signal occurs;

recovering the first input signal includes recovering the first input signal using the delayed second input signal when a negative transition of the first input signal occurs;

inverting the second input signal includes inverting the second input signal when a positive transition of the second input signal occurs; and recovering the second input signal includes recovering the second input signal using the delayed first input signal when a negative transition of the second input signal occurs.

* * * * *

UNITED STATES PATENT AND TRADEMARK OFFICE
CERTIFICATE OF CORRECTION

PATENT NO.    : 6,239,618 B1
DATED         : May 29, 2001
INVENTOR(S)   : Porter et al.

It is certified that error appears in the above-identified patent and that said Letters Patent is hereby corrected as shown below:

<u>Column 3,</u>
Line 22, please insert the word -- the -- before the word "type".
Line 63, please replace the word "sign" with the word -- signal --.

<u>Column 4,</u>
Line 51, please replace the word "GATE 14" with the word -- GATE14 --.

<u>Column 5</u>
Line 12, please replace the word -- included -- with the word "include".

<u>Column 7,</u>
Line 9, please replace the word "put-down" with the word -- pulldown --.
Line 33, please replace the word "inverted" with the word -- inverter --.

<u>Column 8,</u>
Line 46, please replace the word "an" with the word -- a --.
Line 52, please replace the word "of" with the word -- or --.

<u>Column 9,</u>
Line 15, please replace the misspelled word "transitior" with the word -- transition --.

<u>Column 10,</u>
Line 65, please replace the word "terminal" with the word -- terminals --.

<u>Column 11,</u>
Line 5, please replace the word "terminal" with the word -- terminals --.

<u>Column 12,</u>
Line 50, please delete the word "is."

Signed and Sealed this

Eighth Day of June, 2004

JON W. DUDAS
*Acting Director of the United States Patent and Trademark Office*